(12) United States Patent  (10) Patent No.: US 8,854,049 B2
Bogenberger et al.  (45) Date of Patent: Oct. 7, 2014

(54) TIMER UNIT, SYSTEM, COMPUTER PROGRAM PRODUCT AND METHOD FOR TESTING A LOGIC CIRCUIT

(75) Inventors: Florian Bogenberger, Poing (DE); Leos Chalupa, Jemnice (CZ)

(73) Assignee: Freescale Semiconductor, Inc., Austin, TX (US)

( * ) Notice: Subject to any disclaimer, the term of this patent is extended or adjusted under 35 U.S.C. 154(b) by 1196 days.

(21) Appl. No.: 12/676,699

(22) PCT Filed: Sep. 25, 2007

(86) PCT No.: PCT/IB2007/053878
§ 371 (c)(1),
(2), (4) Date: Mar. 5, 2010

(87) PCT Pub. No.: WO2009/040608
PCT Pub. Date: Apr. 2, 2009

(65) Prior Publication Data
US 2010/0213964 A1  Aug. 26, 2010

(51) Int. Cl.
*G01R 31/02* (2006.01)
*G01R 31/317* (2006.01)
(52) U.S. Cl.
CPC .... *G01R 31/31701* (2013.01); *G01R 31/31727* (2013.01)
USPC ....... 324/537; 324/750.01; 324/532; 702/176
(58) Field of Classification Search
USPC ....................................................... 324/532
See application file for complete search history.

(56) References Cited

U.S. PATENT DOCUMENTS

| 4,987,363 | A | * | 1/1991 | Gibbs et al. | 324/142 |
| 5,270,958 | A | * | 12/1993 | Dastous | 700/306 |
| 5,974,364 | A | * | 10/1999 | Kim | 702/125 |

(Continued)

FOREIGN PATENT DOCUMENTS

| JP | 05087629 A | 4/1993 |
| JP | 07134661 A | 5/1995 |

OTHER PUBLICATIONS

International Search Report and Written Opinion correlating to PCT/IB2007/053878 dated Jun. 19, 2008.

*Primary Examiner* — Richard Isla Rodas

(57) ABSTRACT

A timer unit includes a timer for timing the period of time the logic circuit has been in the self-test mode. A comparator is connected to the timer, for comparing the period of time with a maximum for the period of time the logic circuit is allowed to be in the self-test mode and outputting an error signal when the period of time exceeds the maximum. The test timer unit further includes a mode detector for detecting a switching of the logic circuit to the self-test mode. The mode detector is connected to the timer, for starting the timer upon the switching to the self-test mode and stopping the timer upon a switching of the logic circuit out of the self-test mode. The timer unit can be used in a system for testing a logic circuit which includes a test routine module containing a set of instructions which forms a test routine for performing a test on a tested part of the logic circuit. The system has a mode control unit containing a set of instructions which is executable by the logic circuit, for switching the logic circuit from and to a test mode in which a part of the logic circuit can be subjected to a selected test by executing a selected test routine.

20 Claims, 3 Drawing Sheets

(56) References Cited

U.S. PATENT DOCUMENTS

| | | |
|---|---|---|
| 6,260,162 B1 | 7/2001 | Typaldos |
| 6,570,400 B2 * | 5/2003 | Habersetzer et al. ...... 324/750.3 |
| 6,732,308 B1 | 5/2004 | Leung |
| 6,785,325 B1 | 8/2004 | Liu et al. |
| 6,807,115 B2 * | 10/2004 | Kanetani et al. .............. 365/201 |
| 7,239,125 B2 * | 7/2007 | Hemminger et al. ......... 324/142 |
| 7,437,647 B2 * | 10/2008 | Chevallier ..................... 714/745 |
| 2007/0162663 A1 * | 7/2007 | Tang ............................... 710/62 |

* cited by examiner

TIMER UNIT, SYSTEM, COMPUTER PROGRAM PRODUCT AND METHOD FOR TESTING A LOGIC CIRCUIT

FIELD OF THE INVENTION

This invention relates to timer unit, to a system for testing a logic circuit, to an assembly, to an apparatus including a system for testing a logic circuit, to a computer program product and to a method for testing a logic circuit.

BACKGROUND OF THE INVENTION

Systems for testing logic circuits are known in the field of data processing. For example, it is known to test digital processors with so called 'self-test software' for digital processors used for safety relevant applications or other applications which require a high reliability or operational availability, such as chassis control or power train control in vehicles. The self-test software is typically embedded in the application run by the digital processor and consists of a set of test routines, and an interfacing program between the test routines and the user application. Each test routine represents a piece of code which is designed to perform a test on a part of the logic circuit in order to detect physical defects. The test routine reports a result of the test to the interfacing program. The interfacing program determines an overall result from the test results reported by the individual test routines.

Self-test software is often used in safety relevant applications, such as control of cars or airplanes, and it is often required that self-test software meets the safety requirements. The self test software may switch parts of the system to specific modes or change the system to specific states particularly suitable for testing. As the self-test software should test those system parts that are used for the application there is a potential for negative interference of the self test software with the application if the self test software is activated incorrectly, for example outside a specific test window in the application schedule. Systems are known in which a so called 'watch-dog timer' is provided. The watch-dog timer is activated by the application at the beginning of running the self-test test software and measures the period of time the self-test is taking. The watch-dog timer compares the measured period with a threshold. When the measured period exceeds the threshold, the watch-dog timer outputs a warning.

However, a disadvantage of the known systems is that there is a risk that (a part of) the self-testing is performed without activating the watch-dog timer. For example, without being noticed as an error, the self-test software may be activated without starting the watchdog timer due to a fault in the application run by the digital processor. Also, the self-test software may not be entered at the correct address, causing the watchdog timer not being activated. Another situation in which the watchdog timer may be unintentionally not activated is when the system enters unintended a specific test mode due to a fault.

SUMMARY OF THE INVENTION

The present invention provides a timer unit, a system, an assembly, an apparatus, computer program products and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
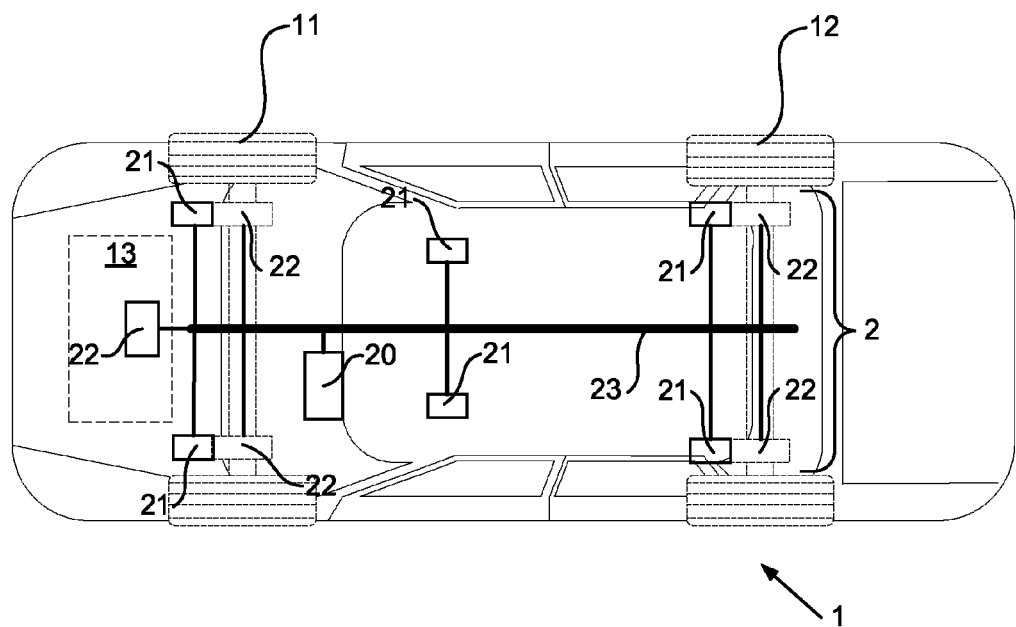
FIG. 1 shows an example of an embodiment of an apparatus in which a system for testing a logic circuit may be used.

Referring to FIG. 1, an example of an apparatus is shown therein. The example shown in FIG. 1, is a motorized vehicle, and more in particular is a car 1. The car 1 may include an assembly 2 of a logic circuit 20 and a test system 25. (For sake of simplicity the test system 25 is not shown in FIG. 1.).

The logic circuit 20 may, as is explained below in more detail, for example execute a data processing application (APP) 24. The data processing application may for instance be a control application for controlling the operation of a physical device and for instance control a part of the vehicle, such as for example an electronic stability control application. However, the data processing application may also be another type of application, and for example be an application which controls a medical system such as a patient monitoring system, a security application, for example an application which controls financial transactions or encrypts data or any other type of application that requires the logic circuit on which the application is running to be tested.

The data processing application 24 may, for instance, control actuators 22 to correct the movement of the car 1. The data processing application 24 may, for example, control individual brakes acting on the front wheels 11 or the rear wheels 12 and/or control the power of an engine 13, in order to correct, for example, under-steer or over-steer of the car 1. The data processing application 24 may further control the actuators 22 based on the information provided by sensor 21, for example in order to prevent the car 1 from slipping or otherwise correct the movement of the car 1.

The logic circuit 20 may for example be connected to sensors 21 and actuators 22. The assembly 2 may, as shown in the example of FIG. 1, include a bus 23 which connects the sensors 21 and actuators 22 to the logic circuit 20. For instance, the logic circuit 20 may receive from the sensors 21 signals representing information about, for example, the acceleration and/or rotation of the car 1. The logic circuit 20 may for instance receive from the sensors 21 information about a drivers intended direction in steering and braking inputs given by the driver, for instance by sensing movement of a steering wheel or a braking paddle, and/or information about to the vehicle's response, for example in terms of the lateral acceleration, rotation and individual wheel speeds. The data processing application 24 may use the information from the sensors 21 to control the actuators 22 and hence, for example, provide an electronic stability control (ESC) to the vehicle.

Figure 2:
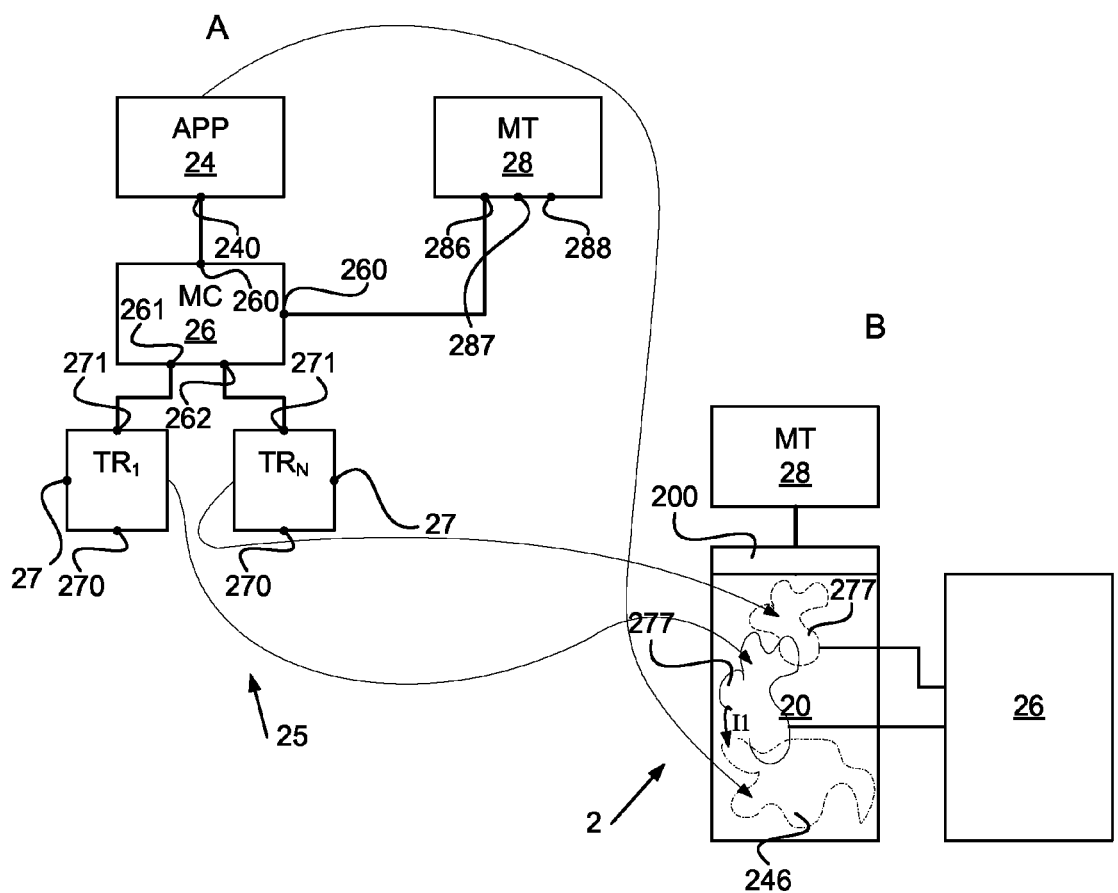
FIG. 2A shows a block diagram of hierarchical representation of a first example of an embodiment of a system for testing a logic circuit and FIG. 2B shows a block diagram of a hardware representation of the first example.

Referring to FIGS. 2A and 2B, the assembly 2 may include a test system 25. The test system 25 may be arranged to test the logic circuit 20. The test system 25 may for instance include a mode control unit (MC) 26, one or more test routine modules 27 and a timer unit 28. It will be apparent that the timer unit 28 may be used in other types of assemblies, and for example be connected to a logic circuit 20 to determine the period of time of other processes on the logic circuit 20 such as other types of tests, the processing of interrupts, idle time processes or other suitable types of processes.

The test routine modules 27 may each contain a set of instructions. The set may form a test routine $TR_1 \ldots TR_N$ for performing a test on a tested part 277 of the logic circuit 20. The set of instructions may for example form a self-test routine, for example stored in a memory, which is executable by one or more self-testing parts 277 of the logic circuit (20). However the test routine module 27 may be implemented in a different manner, and for example be implemented as a application specific integrated circuit (ASIC) which can execute the test-routine or other suitable type of programmable or non-programmable hardware.

The mode control unit 26 may contain a set of instructions for switching the logic circuit from and to a self-test mode in which one or more parts of the logic circuit 20 can execute one or more selected test routines $TR_1 \ldots TR_N$, and hence subject the parts 277 to one or more selected self tests. The logic circuit 20 may function differently in the self-test mode than in other modes in a way that is particularly suitable for testing the logic circuit 20. For example, in the self-test mode certain parts of the logic circuit 20 may be blocked or be switched off. The instructions may for example be executable by the logic circuit 20, in which case the mode control unit 26 may include a memory connectable to the logic circuit 20. However, the instructions may also be executable by another device, in which case, for example, the mode control unit 26 may be implemented as a programmable circuit, such as a general purpose processor or non-programmable circuit, such as an ASIC configured to execute the instructions and which is separate from the logic circuit 20. For example the mode control unit may cause the logic circuit 20 to change internal states which are not directly accessible except in a dedicated self test mode. The resulting state of logic circuit 20 may be such that it cannot be reached by the application software or that the application software would cause a system failure when operating out of this state. For example, the mode control unit 26 may cause the logic circuit to safe or restore its internal state to or from memory in order not to cause the application to cause a system failure. For example, the mode control unit 26 may cause the logic circuit to store data into memory, for example information about the state of the application 24 being executed when the logic circuit 20 is switched to the self-test mode.

As illustrated in FIG. 2A, the data processing application 24 may for example be connected to the mode control unit 26. In the example, the data processing application 24 is connected with an interface 240 to a control interface 260 of the mode control unit 26. The data processing application 24 may control the mode control unit 26 via the connection, and for example activate the mode control unit 26 to switch the logic circuit 20 from a normal mode to a self-test mode or vice versa.

Figure 3:
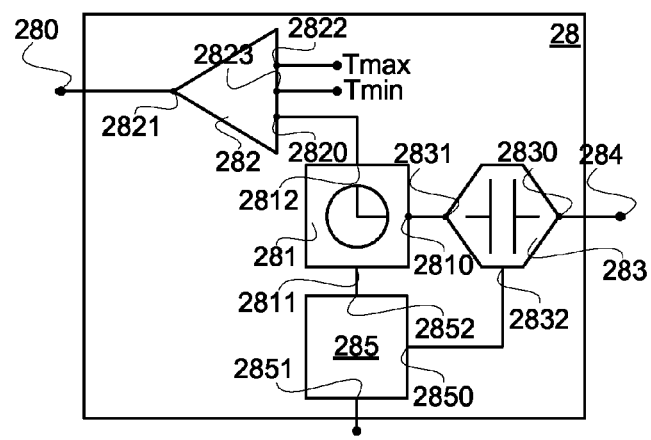
FIG. 3 shows a block diagram of a test timer unit suitable for the example of FIG. 2.

The test timer unit 28 may, as shown in FIG. 2B, be connected to the logic circuit 20 and time the period of time the logic circuit 20 is in the self-test mode or another type of non-normal mode. Although in the following an example is described of an application in which the timer unit 28 can measure the period of time the logic circuit 20 is in a self-test mode, it will be apparent that the timer unit 28 may measure the period of time the logic circuit 20 is in another type of non-normal mode such as one of more of: another type of test mode (such as a production test mode in which the logic circuit 20 is tested by an external device), an interrupt mode, an idle mode or a low power mode. Thus, in the below instead of the self-test mode, a non-normal mode, a test mode, an interrupt mode, an idle mode and/or a low power mode may be used instead. As illustrated in FIG. 3 in more detail, the test timer unit 28 may for example include a timer 281 and/or a comparator 282 and/or a mode detector 283.

The timer 281 may measure the period of time the logic circuit has been in the self-test mode. The comparator 283 may be connected to the timer 281. The comparator 283 may compare the period of time measured by the timer 281 with a time-out value Tmax corresponding to the maximum for the period of time the logic circuit is allowed to be in the self-test mode. The comparator 283 may output an error signal when the timer 281 times out or expires, that is when the period of time exceeds the maximum. Thereby, it may be prevented that the self-test leads to a runaway of the logic circuit 20 and hence to a undesired or even dangerous system state, and accordingly the reliability of the self-testing and the safety of the system may be improved.

The mode detector 283 may be able to detect a switching of the logic circuit to the self-test mode and start the timer 281 upon a detection of a switching to the self-test mode and stop the timer upon a switching of the logic circuit out of the self-test mode. Thereby, the measurement of the period of time the self-test is or has been taking may be independent from the operation of the application. Hence, when the self-test mode is entered by accident, this is likely to be detected by the test timer unit 28, because the timer 281 will be started upon detection of entry of the self-test mode, and the period of time measured by the timer 281 will exceed the maximum, resulting in outputting the error signal. Furthermore, the behaviour of the test timer unit 28 can be verified for correctness by switching the logic circuit into the self-test mode and determining whether the timer 281 is started and the error signal is outputted by the comparator when the timer 281 times out.

The timer 281 may be implemented in any manner suitable to measure the period of time. As shown in FIG. 3, the timer 281 may for example have a control input 2810 via which the timer 281 can be stopped or started. The timer 281 may for example receive a start signal in response of an entry in the self-test mode and receive a stop signal when the logic circuit 20 exits the self-test mode, for example from the mode detector 283. The timer 281 may, in response to the start signal, start measuring the time. The timer 281 may stop the measurement in response to the stop signal. The timer 281 may further include an output 2811. The timer 281 may present at the output 2811 information about a current time indicated by the timer.

It will be apparent that the timer may start measuring the time with a timer offset, for example when the timer 281 has been paused (e.g. in response to the stop signal) without being reset. The timer 281 may for example count the number of clock cycles passed since the timer start signal has been received and adjust an initial value which the counter had at the time the timer start signal has been received with the counted number. The timer 281 may output this adjusted value to the comparator 283.

The timer 281 may include a control input 2811 via which the time indicated by the timer 281 may be set. The timer 281 may allow setting the time only when logic circuit 20 is not in self-test mode, so that a faulty execution in self-test mode cannot falsify the time period measurement. Also, the timer 281 may be inhibited from being changed during the self-test mode by any other means than the automatic decrementing or incrementing of the timer 281 due to the measurement of the period of time. For example, the timer 281 may be reset by the data processing application before the data processing application initiates a self-test of the logic circuit 20. The timer 281 may also be set in response to a detected exit out of the self-test mode by the logic circuit 20.

For example, as shown in FIG. 3, the test timer unit 28 may include a timer controller 285. The timer controller 285 may be connected to the mode detector 283 and the timer 281. In FIG. 3, an input 2850 of the timer controller 285 is connected to an output 2832 of the mode detector 283. An output 2852 of the timer controller 285 is connected in FIG. 3 to the control input 2811 of the timer 282. The timer controller 285 may for example receive, at the input 2850, a mode exit signal from the mode detector 283 indicating that the mode detector 283 has detected that the logic circuit 20 exits the self-test mode (and hence when the timer 281 is stopped by the mode detector 283). The timer controller 285 may in response to the mode exit signal set the value indicated by stopped timer 281 to a predetermined value.

The timer value indicated by the stopped timer 281 may for example be set to a value about the same as the time-out value Tmax. Hence, the period of time indicated by the stopped timer 281 corresponds to the afore mentioned maximum. The timer controller 285 may also reset the time-out value Tmax such that the time indicated by the stopped timer 281 corresponds to the maximum in another manner, e.g. by setting only the time-out value Tmax (to the value indicated by the stopped timer 281) or setting the time-out value Tmax and the value indicated by the stopped timer to the same value. Thus, when the logic circuit 20 is not in the self-test mode and by accident enters the self-test mode, the stopped timer 281 will be started but will time-out (almost) immediately (unless of course the timer is reset such that the value indicated by the timer and the time-out value Tmax are no longer the same). Thereby, an unintended entry into the self-test mode, and hence faulty behaviour of the logic circuit, may be detected quickly.

The timer controller 285 may for example be configured to set, when the logic circuit is switched to the self-test mode, the timer 281 or the time-out value Tmax such that the difference $\Delta(T-Tmax)$ between the timer value T and the time-out value Tmax corresponds to the period of time the logic circuit is allowed to be in the self-test mode. The time controller 285 may for example set the timer value T and the time-out value Tmax to a respective value which depends on the specific test $TR_i$ to be performed, for example, the timer controller 285 may receive an indication of the test $TR_i$ or the specific values, from the data processing application 24 via the input 2851. As shown in FIG. 3, for example, the timer controller 285 may have an input 2851 at which a set signal can be received, for example from the data processing application 24 or another source. In response to the set signal, for example, the timer 281 may be set to an initial value (e.g. to zero in case of an up-timer or to a value corresponding to the maximum in case of a down timer).

The maximum Tmax for the period of time the logic circuit 20 is allowed to be in the self-test mode may be set to any value suitable for the specific implementation. The maximum may for example be set to slightly exceed to the period of time needed to perform the self-test. For example, in case the timer counts the number of clock cycles, the maximum may be set to a number of clock cycles slightly exceeding the number of clock cycles needed for the self-test. The maximum may for example be set to a period of a few hundred or a few thousand clock cycles.

The mode detector 283 may be implemented in any manner suitable to detect the mode switching. As for example shown in FIG. 3, a detector input 2830 of the mode detector 283 may be connected, via an input 284 of the test timer unit 28, to the logic circuit 20, in order to monitor a part of the logic circuit 20. For instance, the mode detector 283 may monitor a register or other part of the logic circuit 20 in which data is stored when the logic circuit 20 is brought into the self-test mode. Also, the mode detector 283 may for example monitor certain locations in a memory in which the logic circuit 20 safes its internal state upon entry of the self-test mode, monitor whether or not parts of the logic circuit turned off in the mode are switched off. The mode detector may for example detect an idle mode by monitoring whether or not the logic circuit 20 has operations waiting in a queue or not or measure the rate of a clock to determine whether the logic circuit entered the idle mode.

The mode detector 283 may, as shown in FIG. 3, be connected with an output 2831 to the control input 2810 of the timer 281. The mode detector 283 may output a timer start signal to the control input 2810 when the mode detector 283 detects that the logic circuit 20 enters into the self-test mode and output a timer stop signal when the mode detector 283 detects that the logic circuit 20 exits the self-test mode. The timer may be started and stopped in response to the timer start signal and the timer stop signal respectively.

The mode detector 283 may, as shown in FIG. 3, be connected with an output 2832 to the input 2850 of the timer controller 285. The mode detector 283 may output, e.g. via the output 2832, a set signal to the timer controller 285 when the mode detector 283 detects that the logic circuit 20 exits the self-test mode. In response to the set signal, the timer controller may, as described above, set the timer and/or time-out value Tmax such that the difference between both corresponds to the period of time the logic circuit 20 is allowed to be in the self-test mode.

The comparator 283 may be implemented in any manner suitable to compare the period of time with the time-out value Tmax. As shown in FIG. 3, the comparator 283 may for instance have an input 2820 which is connected to the output 2811 of the timer 281. As shown in FIG. 3, the comparator 283 may include threshold inputs 2822, 2823 at which one or more threshold values Tmax, Tmin may be presented with which the information received from the timer 281 is compared. The comparator 282 may for example output an error signal in case the time indicated by the timer 281 exceeds the threshold value Tmax which corresponds to the maximum (in case the timer is an up-timer) or when the time indicated by the timer 281 comes below the threshold value Tmax (in case the timer is a down-timer).

The comparator 283 may be configured to compare the period of time indicated by the stopped timer with a minimum Tmin for the self-test duration, and output an error signal in case the period of time indicated by the stopped timer is less than the minimum. As illustrated in FIG. 3, the comparator 282 may for example have a threshold value input 2823 at which a threshold value Tmin may be presented which corresponds to the minimum. The comparator 282 may compare the time received at the input 2820 with the threshold value Tmin when the timer 281 is stopped. The comparator 282 may for example output an error signal in case the time indicated by the stopped timer 281 is below the threshold value Tmin in case the timer is an up-timer or when the time indicated by the timer 281 comes exceeds the threshold value Tmin in case the timer is a down-timer.

Figure 4:
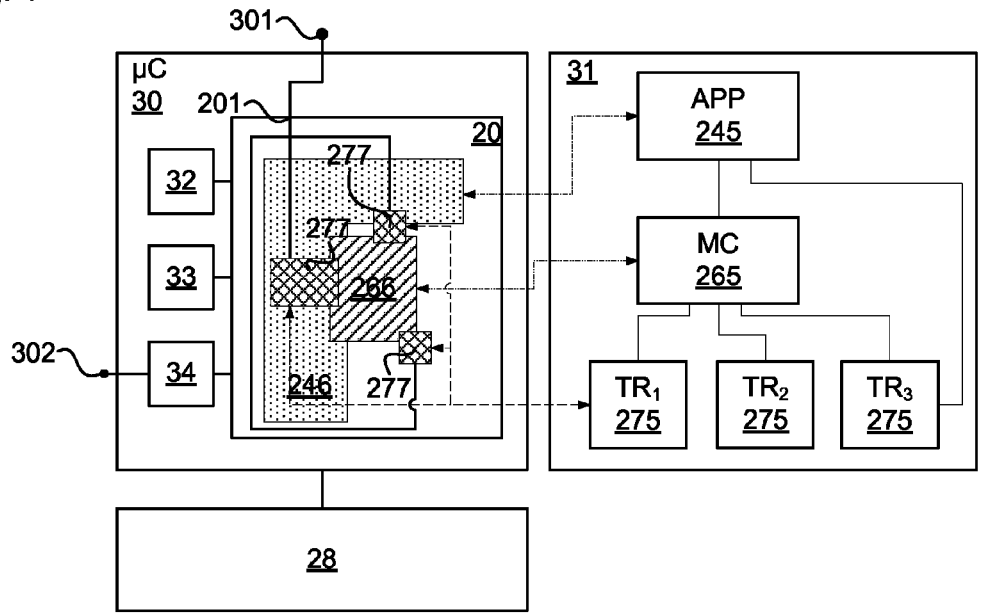
FIG. 4 shows a block diagram of a hardware representation of an example of an embodiment of an assembly with a system for testing a logic circuit in accordance with an embodiment of the invention.

The test timer unit 28 may be implemented in any manner suitable for the specific implementation. As shown in FIG. 4, the test timer unit 28 may for instance be implemented on a logic circuit separate from the logic circuit 20 which executed the self-test. As shown in FIG. 2B, the test timer unit 28 may be connected to the logic circuit 20. The test timer unit 28 may for example be implemented as a separate piece of hardware device and for example be part of a separate microprocessor or a microcontroller. The microprocessor may for example include a central processing unit (CPU) and/or a coprocessor and/or a digital signal processor and/or an embedded processor.

Figure 5:
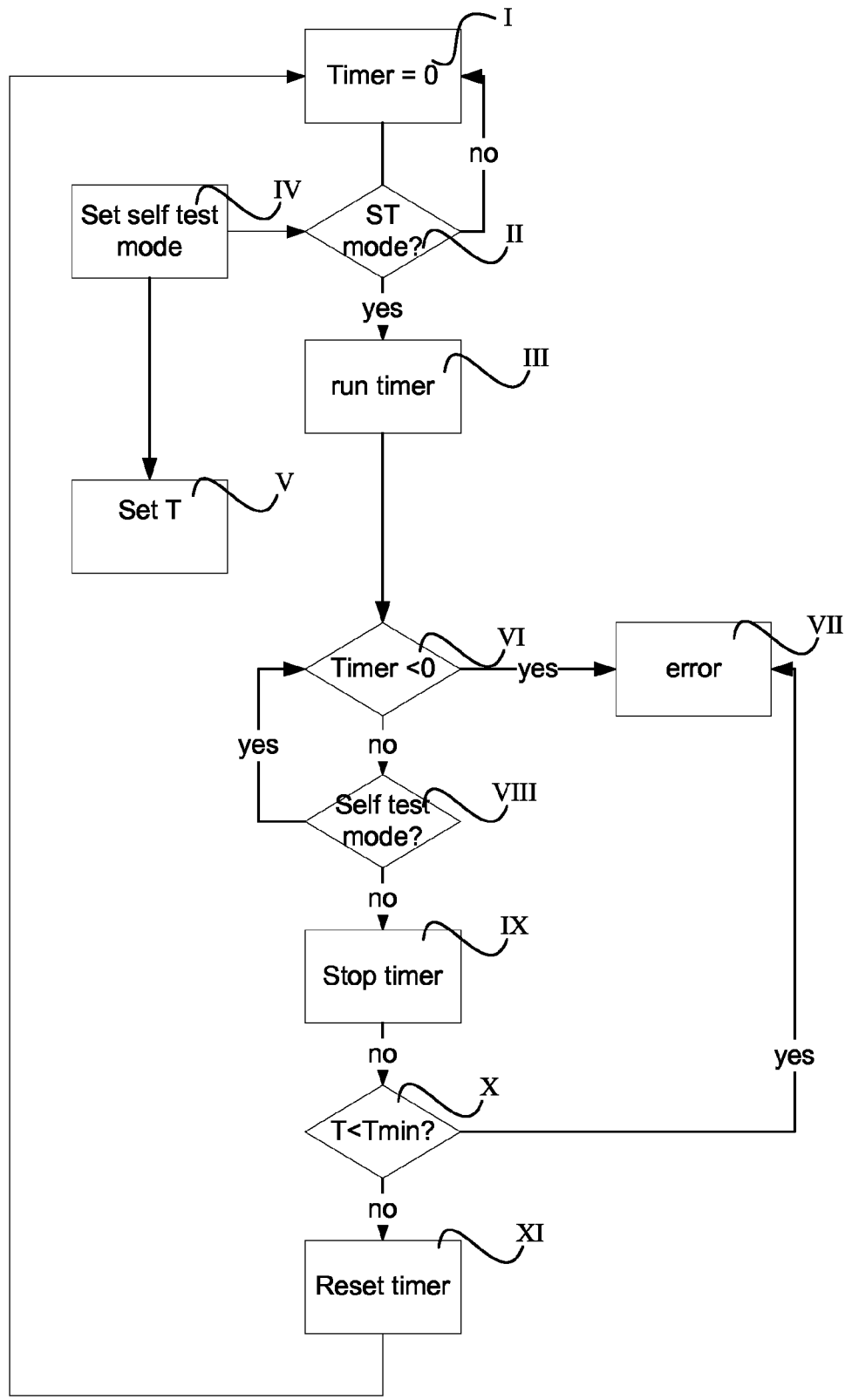
FIG. 5 shows an example of a flow-chart of a method for testing a logic circuit.

The test timer unit 28 may for example perform an operation as illustrated in FIG. 5. As shown in FIG. 5 with step I, when the logic circuit is in normal mode (that is not in the self-test mode), the timer value may be zero (e.g. when the timer is a down-timer and the threshold-value Tmax is set to zero) and the timer may not be running. When the data processing application initiates a self-test and sets the logic circuit 20 to the self-test mode, as indicated with step IV, the timer value T and/or the threshold value Tmax may be set. The values T, Tmax may for example be set to a value, as indicated with step V, such that the difference $\Delta(T-Tmax)$ between the timer value and/or the threshold corresponds to the period of time the logic circuit 20 is allowed to be in the self-test mode (for example in terms of the maximum number of clock cycles the self-test is allowed to take), for example by a test shell or the data processing application itself. The self-test mode may then be detected, e.g. by the detector 283, as indicated with step II and the timer started, as indicated with step III, When the timer times out, as indicated with step VI in which the timer is assumed to be a down-timer, an error may be outputted, as indicated with steps VII. When the self-test is completed (or the logic circuit 20 exits self-test mode for another reason), the mode change is detected, as indicated with step VIII and the timer is stopped, as indicated with step IX. The timer may then be reset to the initial value in step XI, for example to zero. As indicated with step X, when the stopped timer indicates a time shorter than the minimum Tmin, an error signal may be outputted.

The test routine modules 27 may be implemented in any manner suitable to self-test a part of the logic circuit 20. For instance, as shown in FIG. 3, the test routine modules 27 may for example include one or more memory units 31 in which data 275 can be stored, the data representing instructions executable by the logic circuit 20. Upon activation of the respective test routine $TR_1 \ldots TR_N$ by the mode control unit 26, the part 277 of the logic circuit 20 may initiate executing the instructions defined in the memory unit 275. (In FIG. 3, for sake of clarity, the hierarchical relationship between the test routines $TR_1 \ldots TR_N$, the mode control MC and the data processing application APP are indicated with the hairlines connecting data 245,265,275)

The self-testing part(s) 277 may for instance, in accordance with the test routine $TR_1 \ldots TR_N$, perform a logic tests with the logic circuit 20. For instance, the self-testing part(s) 277 may perform a logic test by having the self-testing part 277 (which may be a part or the entire logic circuit) of the logic circuit performing a predetermined type operation, such a binary operation (for example an exclusive OR) or a calculation (for example a square root calculation). For instance, the test routine 27 may input predetermined test data in the self-tested part 277 of the logic circuit 20, make the self-testing part(s) 277 of the logic circuit perform a predetermined type of test operation and monitor the data output by the self-testing part of the logic circuit 20 after the test operation.

The test routine $TR_1 \ldots TR_N$ may be any routine suitable for the self-testing parts 277 to detect a faulty behaviour on their sides. The self-testing part 277 executing a test routine $TR_1 \ldots TR_N$ may for instance determine a self-test signature, such as an N-bit number, and, for example, check the correctness of the self-test signature. The self-testing part 277 executing a test routine $TR_1,TR_N$ may for instance compare the self-test signature with a predetermined signature to determine whether or not the test routine has detected a fault in the logic circuit 20. For instance, in case the self-test signature does not correspond to a sufficient degree to the predetermined signature, the self-testing part 277 executing a test routine $TR_1,TR_N$ may determine that the test routine has detected a fault in the logic circuit 20, and else that the test routine has not detected a fault in the logic circuit 20. The self-testing part 277 executing a test routine $TR_1 \ldots TR_N$ may output, for instance to the mode control unit 26 or to the data processing application 24 the determined outcome and/or the self-test signature. The test routine module 27 may contain a set of instructions for example defining an operation which may be described with the following pseudo-code:

```
start
{
perform self-test and determine test_signature
if test_signature== predetermined signature
    then test_result= correct
    else test_result= fault
output= test_result
}
end
```

The self-testing part 277 may determine the self-test signature in any suitable manner. For example, the part 277 of the logic circuit 20 may perform, in accordance with the instructions, one or more predetermined operations which change the state of (the self testing part 277 of) the logic circuit 20. The self testing part 277 may for instance determine a signature value which is unique for the sequence of state transitions of the logic circuit 20 or for which only a very small chance exists that another sequence of state transitions will give the same value. The part 277 may then determine the correctness of the determined signature value, for example by comparing the determined signature value with a predetermined signature value. In case the determined signature value is not correct, this implies that the self-testing part 277 exhibits a faulty behaviour and accordingly that the result of the self-test is that the self-testing part 277 has failed the self test. The self-testing part 277 may output the result of the self-test, for example as data including the self-test signature and the determined outcome of the self-test using the interfaces 270, 271, to the mode control unit 26 and/or other components units or devices, such as the data processing application 24 or the timer unit 28.

The test routines $TR_1 \ldots TR_N$ may each include instructions for testing different parts of the logic circuit 20. As illustrated in FIG. 3, for instance one or more of the test routines $TR_A$ may, when executed, self-test a first part 277 of the logic circuit 20. One or more other test routines $TR_B$ may, when executed, self-test a second part 277 of the logic circuit 20. As shown in FIG. 2B, the test routines $TR_1,TR_N$ may for example test (partially) overlapping parts 277 of the logic circuit 20. As shown in FIG. 3, the self-testing parts 277 may have an overlap with, for example, a part 246 of the logic circuit 20 executing a data processing application APP or with a part 266 of the logic circuit 20 executing the mode control application MC. Furthermore, the parts 277 executing the test routines $TR_1, TR_N$ may operate independently from each other, e.g. by executing the test routines $TR_1, TR_N$ at different points in time and for example use different resources, with or without any overlap in the parts 277 of the logic circuit 20 executing the test routine. Thereby, the chance that intermittent faults, or faults caused by effects which do not cause a physical defect (e.g. EMC), are detected may be increased, (for example when the areas in the overlaps are tested at different points in time). Furthermore, when the self-testing parts 277 do not overlap completely, an analysis of multiple self-test results enables a more precise location of a fault and therefore to determine more accurately its severity for the data processing application.

The logic circuit 20 may be implemented in any manner suitable for the specific implementation. The logic circuit 20 may for instance be a programmable device and may be connected to one or more memories 31, in which instructions executable by the logic circuit can be stored, for instance during manufacturing of the logic unit or after manufacturing. The logic circuit 20 may for example be part of a microprocessor. The microprocessor may for example include a central processing unit (CPU) and/or a coprocessor and/or a digital signal processor and/or an embedded processor. The logic circuit 20 may also be part of a microcontroller (μC), such as a controller for an electronic stability control (ESC) system used to modulate braking and traction forces of a vehicle, such as a car.

As shown in FIG. 3, the logic circuit 2 may for instance include one, or more, processor cores 30 which can execute the instructions in the memory 31 connected to the processor core. At least a part of the processor core may then be tested by a test application. The processor core may for instance include the logic required to execute program code in the form of machine code. The processor core 30 may for instance at least include an instruction decoder, an arithmetic unit, an address generation unit, and a load/store unit. The microprocessor may for example include, in addition to the processor core, inputs/outputs 301,302 or other components 32-34, such as and/or communication interfaces and/or coprocessors and/or analog-to-digital converters and/or clocks and reset generation units, voltage regulators, memory (such as for instance flash, EEPROM, RAM), error correction code logic and/or timers or other suitable components.

As shown in FIG. 3, for instance, the data processing application 24, the test routine modules 27 and/or the mode control unit 26 may include a memory 31 connectable to the logic circuit 20 in which memory sets of data 245,265,275 representing one or more set of instructions executable by the logic circuit 20 are stored, the set forming for instance the data processing application, one or more test routines $TR_1 \ldots TR_N$ and/or the mode control application MC. As shown in FIG. 3, for instance, in the memory 31 a set 245 forming the data processing application APP may be stored. Also, in the memory 31 a set of instructions 265 forming the mode control application MC may be stored and/or one or more sets 275 of instructions forming the test routines $TR_1 \ldots TR_N$. Parts 246, 266, 277 of logic circuit 20 may execute the instructions and hence operate, respectively as a data processing application module, a mode control module or a self-testing part.

The invention may also be implemented in a computer program for running on a computer system, at least including code portions for performing steps of a method according to the invention when run on a programmable apparatus, such as a computer system or enabling a programmable apparatus to perform functions of a device or system according to the invention. Such a computer program may be provided on a data carrier, such as a CD-ROM or diskette, stored with data loadable in a memory of a computer system, the data representing the computer program. The data carrier may further be a data connection, such as a telephone cable or a wireless connection. The computer program product may for instance include program code portions for executing a test application and/or a test routine and/or a module.

The computer program may include a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

In the foregoing specification, the invention has been described with reference to specific examples of embodiments of the invention. It will, however, be evident that various modifications and changes may be made therein without departing from the broader spirit and scope of the invention as set forth in the appended claims. For instance, the memory 31 may include any medium suitable to store information, such as for instance a register, random access memory (RAM), cache memory or any other medium suitable to store information. The memory may for instance be a volatile or non-volatile memory.

Also, for example, the test routine output interface may include a software output interface and/or a hardware output interface. Furthermore, for instance, the test application may be for example executable separate from the data processing application or be implemented as a library or other source of instructions that can be executed by the data processing application.

Also, as for example illustrated in FIG. 3, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses. For example, the timer unit 28 may be implemented on a separate microprocessor or other logic device connectable to the logic circuit 2. Also, for example, the mode control unit 26 and/or the data processing application module 24 and/or the timer unit 28 may be implemented as devices separate from the logic circuit 20, for example on separate dies packages in the same package as the logic circuit 20 or be implemented as separate packages.

Also, devices functionally forming separate devices may be integrated in a single physical device. For example, as e.g. shown in FIG. 3, the test system 25 and the logic circuit 20 may be implemented on the same microprocessor. E.g., the mode control unit 26 and/or the data processing application module 24 and/or the timer unit 28 may be i implemented on a single device and for example be part of the logic circuit 20.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A timer unit for measuring a period of time of an operation of a logic circuit comprising:
   a timer for measuring the period of time said logic circuit has been in a non-normal mode different from a normal operation mode;
   a comparator connected to said timer, for comparing said measured period of time with a maximum for the period of time said logic circuit is allowed to be in said non-normal mode and outputting an error signal signifying a fault in operation of the logic circuit in the non-normal mode when said measured period of time exceeds said maximum; and
   a mode detector for detecting a switching of said logic circuit from a normal operation mode to said non-normal mode, said mode detector being connected to said timer, for automatically starting said timer upon a detection of a switching of said logic circuit to said non-normal mode and automatically stopping said timer upon a detection of a switching of said logic circuit out of said non-normal mode.

2. A timer unit as claimed in claim 1, including a timer controller connected to said mode detector and said timer, for resetting the stopped timer or setting said maximum, such that the period of time indicated by said stopped timer is the same as, or exceeds, said maximum.

3. A timer unit as claimed in claim 2, wherein said timer controller sets, when said logic circuit is switched to the non-normal mode, said timer and/or said maximum such that the difference between the period of time indicated by said timer and said maximum corresponds to the period of time said logic circuit is allowed to be in said non-normal mode.

4. A timer unit as claimed in claim 2, wherein the resetting the timer or setting the maximum is not permitted in the non-normal mode.

5. A timer unit as claimed in claim 2, wherein said comparator compares the period of time indicated by the stopped timer with a minimum for the duration of an operation to be performed in said non-normal mode, and outputs an error signal in case the period of time indicated by the stopped timer is less than the minimum, wherein the minimum and the maximum are two different values.

6. A timer unit as claimed in claim 2, implemented as a hardware device connectable to said logic circuit.

7. A timer unit as claimed in claim 2, wherein said non-normal mode includes one or more of: a low power mode, interrupt mode, idle mode.

8. A timer unit as claimed in claim 1, wherein said comparator compares the period of time indicated by the stopped timer with a minimum for the duration of an operation to be performed in said non-normal mode, and outputs an error signal in case the period of time indicated by the stopped timer is less than the minimum.

9. A timer unit as claimed in claim 1, implemented as a hardware device connectable to said logic circuit.

10. A timer unit as claimed in claim 1, wherein said non-normal mode includes one or more of: a low power mode, interrupt mode, idle mode.

11. A system for testing a logic circuit, said system comprising:
    at least one test routine module containing a set of instructions forming a test routine for performing a test on a tested part of said logic circuit;
    a mode control unit containing a set of instructions for switching said logic circuit from and to a test mode in which at least one part of said logic circuit can be subjected to at least one selected test by executing at least one selected test routine; and
    a test timer unit as claimed in claim 1.

12. A system as claimed in claim 11, wherein at least one of said test routines is a self-test routine executable by at least one self-testing part of said logic circuit.

13. A system as claimed in claim 12, wherein said logic circuit is part of one or more of the group consisting of: a microprocessor, a central processing unit, a microcontroller, a digital signal processor.

14. A system as claimed in claim 12, wherein said logic circuit is arranged to execute a control application for controlling the operation of at least one actuator.

15. A system as claimed in claim 11, wherein said logic circuit is part of one or more of the group consisting of: a microprocessor, a central processing unit, a microcontroller, a digital signal processor.

16. A system as claimed in claim 15, wherein said logic circuit is a processor core.

17. A system as claimed in claim 11, wherein said logic circuit is arranged to execute a control application for controlling the operation of at least one actuator.

18. An assembly of a logic circuit and a system as claimed in claim 11.

19. A timer unit as claimed in claim 1, wherein said mode detector is to detect the switching of said logic circuit to said non-normal mode by monitoring one or more of:
    a register or other part of the logic circuit in which data is stored when the logic circuit is brought into said non-normal mode;
    locations in a memory in which the logic circuit saves its internal state upon entry into said non-normal mode; and
    whether or not parts of the logic circuit turned off in said non-normal mode are switched off.

20. A method for testing at least a part of a logic circuit, including:
    switching said logic circuit to a test mode in which at least one tested part said logic circuit can be subjected to at least one selected test;
    performing said at least one selected test by at least one tested part of said logic circuit;
    switching said logic circuit out of said test mode after completion of the at least one selected test routine; and
    executing a test timing procedure including:
        detecting a switching of said logic circuit to said test mode;
        starting a timer in response to said detecting, for timing the period of time said logic circuit has been in said test mode;
        comparing said period of time with a maximum for the period of time said logic circuit is allowed to be in said test mode; and
        outputting an error signal when said period of time exceeds said maximum; and comparing the period of time indicated by the stopped timer with a minimum for the duration of an operation to be performed in said non-normal mode, and outputting an error signal in case the period of time indicated by the stopped timer is less than the minimum.

* * * * *